(12) United States Patent
Zhang et al.

(10) Patent No.: US 7,208,049 B2
(45) Date of Patent: Apr. 24, 2007

(54) PROCESS SOLUTIONS CONTAINING SURFACTANTS USED AS POST-CHEMICAL MECHANICAL PLANARIZATION TREATMENT

(75) Inventors: Peng Zhang, Quakertown, PA (US); Brenda Faye Ross, Whitehall, PA (US)

(73) Assignee: Air Products and Chemicals, Inc., Allentown, PA (US)

( * ) Notice: Subject to any disclaimer, the term of this patent is extended or adjusted under 35 U.S.C. 154(b) by 0 days.

(21) Appl. No.: 10/689,402

(22) Filed: Oct. 20, 2003

(65) Prior Publication Data

US 2005/0081885 A1    Apr. 21, 2005

(51) Int. Cl.
*C23G 1/00* (2006.01)

(52) U.S. Cl. .................. 134/3; 134/2; 134/25.4; 134/26; 134/28; 134/29; 134/30; 134/34; 134/36; 134/41; 134/902

(58) Field of Classification Search ............ 134/2, 134/3, 25.4, 26, 28, 29, 30, 34, 36, 41, 902
See application file for complete search history.

(56) References Cited

U.S. PATENT DOCUMENTS

| | | | |
|---|---|---|---|
| 4,374,920 A | | 2/1983 | Wanat et al. |
| 4,786,578 A | * | 11/1988 | Neisius et al. ............ 430/256 |
| 4,833,067 A | | 5/1989 | Tanaka et al. |
| 5,064,749 A | | 11/1991 | Matsumoto et al. |
| 5,098,478 A | | 3/1992 | Krishnan et al. |
| 5,466,389 A | | 11/1995 | Ilardi et al. |
| 5,650,543 A | | 7/1997 | Medina |
| 5,704,987 A | | 1/1998 | Huynh et al. |
| 5,756,267 A | | 5/1998 | Matsuda et al. |
| 5,789,360 A | | 8/1998 | Song et al. |
| 5,977,041 A | * | 11/1999 | Honda ................... 510/175 |
| 6,194,366 B1 | * | 2/2001 | Naghshineh et al. ...... 510/175 |
| 6,261,745 B1 | | 7/2001 | Tanabe et al. |
| 6,277,203 B1 | * | 8/2001 | Jiang et al. ............... 134/2 |
| 6,284,718 B1 | | 9/2001 | Simon |
| 6,310,019 B1 | * | 10/2001 | Kakizawa et al. ........ 510/175 |
| 6,313,182 B1 | | 11/2001 | Lassila et al. |
| 6,465,403 B1 | * | 10/2002 | Skee ........................ 510/175 |
| 6,585,825 B1 | * | 7/2003 | Skee ........................ 134/3 |
| 6,641,986 B1 | * | 11/2003 | Zhang et al. ............. 430/325 |
| 2001/0021489 A1 | | 9/2001 | Wakiya et al. |
| 2002/0016272 A1 | | 2/2002 | Kakizawa, et al. |
| 2002/0055660 A1 | | 5/2002 | Lassila et al. |
| 2002/0077259 A1 | | 6/2002 | Skee |
| 2002/0106589 A1 | * | 8/2002 | Rodney et al. ........... 430/325 |
| 2002/0121287 A1 | * | 9/2002 | Gilton ...................... 134/1.3 |
| 2003/0228762 A1 | * | 12/2003 | Moeggenborg et al. .... 438/691 |
| 2003/0228763 A1 | * | 12/2003 | Schroeder et al. ........ 438/691 |
| 2004/0029395 A1 | * | 2/2004 | Zhang et al. ............. 438/748 |
| 2004/0029396 A1 | * | 2/2004 | Zhang et al. ............. 438/748 |
| 2004/0053172 A1 | * | 3/2004 | Zhang et al. ............. 430/325 |
| 2004/0053800 A1 | * | 3/2004 | Zhang et al. ............. 510/175 |
| 2004/0149309 A1 | * | 8/2004 | Hsu ......................... 134/3 |
| 2004/0204328 A1 | | 10/2004 | Zhang et al. |
| 2005/0029492 A1 | * | 2/2005 | Subawalla et al. ........ 252/79.4 |

FOREIGN PATENT DOCUMENTS

| | | | |
|---|---|---|---|
| EP | 0178495 B1 | | 3/1990 |
| EP | 0231028 B1 | | 8/1991 |
| EP | 1065708 A2 | | 1/2001 |
| EP | 1115035 A1 | | 7/2001 |
| EP | 1389746 A2 | | 2/2004 |
| JP | 2002-020787 | * | 1/2002 |
| JP | 2002148821 | | 5/2002 |
| WO | WO 00/14785 | | 3/2000 |
| WO | WO 00/18523 | | 4/2000 |

* cited by examiner

*Primary Examiner*—Sharidan Carrillo
(74) *Attorney, Agent, or Firm*—Rosaleen P. Morris-Oskanian; Joseph D. Rossi

(57) ABSTRACT

Process solutions comprising one or more surfactants are used to reduce the number of defects in the manufacture of semiconductor devices. In certain preferred embodiments, the process solution of the present invention may reduce defects when employed as a rinse solution either during or after the development of the CMP processing. Also disclosed is a method for reducing the number of defects on a plurality of post-CMP processed substrates employing the process solution of the present invention.

25 Claims, No Drawings

PROCESS SOLUTIONS CONTAINING SURFACTANTS USED AS POST-CHEMICAL MECHANICAL PLANARIZATION TREATMENT

BACKGROUND OF THE INVENTION

As the dimensions of interconnect structures within a semiconductor device become increasingly smaller, there is a need for interlayer dielectric such as low dielectric constant films to, for example, reduce capacitance, power consumption, and cross noise. Low dielectric constant films, i.e., having a dielectric constant of 4.2 or less, are comprised of materials that include, but are not limited to, such as fluorine doped silicate glass (FSG), organosilicate glass (OSG), organofluoro-silicate glass (OFSG), polymeric materials such as silsesquioxanes (HSQ, $HSiO_{1.5}$), methyl silsesquioxanes (MSQ, $RSiO_{1.5}$ where R is a methyl group), and porous low dielectric constant materials.

In the manufacture of integrated circuits, surface planarity is a key processing step. To achieve the degree of planarity needed to produce ultra high density integrated circuits, chemical mechanical planarization is often employed. In CMP processes, polishing and removal of excess material is accomplished through a combination of chemical and mechanical means. In a typical CMP process, a wafer surface may be mechanically scrubbed via a polishing pad while chemically reactive slurry containing abrasive particles flows over and etches various surfaces of the substrate during processing. The combination of mechanical and chemical removal of material during polishing results in planarization of the surface.

One of the disadvantages of CMP may be a higher defect level observed on post-CMP cleaned substrates. The term "defects", as used herein, relates to defects that may reduce the yield, or cause the loss, of the semiconductor device such as the particulates introduced onto the substrate resulting from processing such as submicron abrasive particles (e.g., $SiO_2$ or $Al_2O_3$) from the CMP slurry; particulates either indigenous to or resulting from manufacturing processes such as the residue from the CMP process or reaction products of the CMP slurry; and water-mark type defects. It is necessary to remove the contamination prior to subsequent processing of the substrate to avoid degradation in device reliability and the introduction of defects.

One way to cleanse the substrate of CMP residuum is through one or more aqueous-based rinses in combination with some form of mechanical agitation to remove slurry chemical and abrasive residue from the surface of the substrate. U.S. Pat. No. 5,704,987 describes a two-step polishing method that uses a basic aqueous solution containing a nonionic polymeric surfactant and quaternary ammonium hydroxide in the first step and purified water in the second step. European Patent Application EP 1,065,708 describes a post-CMP cleaning method wherein the wafer is subjected to surfactant-containing megasonic baths that have a pH that matches the pH of the slurry to be removed. Published Application WO 00/14785 describes cleaning an organic dielectric surface after CMP treatment by a combination of mechanical or frictional agitation and aqueous alkaline solution containing a surfactant and a tetra alkyl quaternary ammonium hydroxide compound. Published Application WO 00/18523 describes a method for cleaning hydrophobic surfaces by applying a surfactant-containing solution may further include a chemical enhancer, optionally scrubbing, and then spin-rinsing the substrate.

Yet another method to cleanse the substrate surface of CMP residuum is to employ one or more post-CMP cleaning solutions. These solutions are typically tailored to react and remove certain types of residue such as etching residue (i.e., copper, aluminum, or other metal from the metallization layers) or CMP slurry residue (i.e., oxide or abrasive particles). U.S. Pat. No. 5,466,389 discloses an aqueous-based alkaline cleaning composition that contains a metal ion free base, a nonionic surfactant, and a buffering agent to maintain the pH of the composition between 8 and 10. U.S. Pat. No. 5,789,360 describes a post-CMP cleaning solution containing 0.1% to 99% phosphoric acid, 0.1% to 25% fluoroboric acid, and the balance deionized water. U.S. Pat. No. 6,194,366 discloses a post-CMP cleaning composition that contains a quaternary ammonium hydroxide, an organic amine, a corrosition inhibitor, and water.

Typical surfactants used in the post-CMP cleaning process tend to have poor dynamic wetting capability and high tendency to generate foam. Although they get easily absorbed onto substrate surface, they may be difficult to remove. Post-CMP cleaning is a very dynamic process requiring a surfactant with superior dynamic wetting ability. This is particularly important for hydrophobic surfaces such as low-k dielectrics.

BRIEF SUMMARY OF THE INVENTION

Process solutions for the removal of processing residue from semiconductor substrates following CMP processing and methods employing same are disclosed herein. Specifically, in one aspect of the present invention, there is provided a method for reducing defects in the manufacture of semiconductor devices comprising: providing a post-CMP processed substrate wherein at least a portion of the substrate comprises a low dielectric constant film and contacting the substrate with a process solution comprising about 10 ppm to about 500,000 ppm of at least one surfactant having the formula (I), (II), (III), (IVa), (IVb), (V), (VI), or (VII):

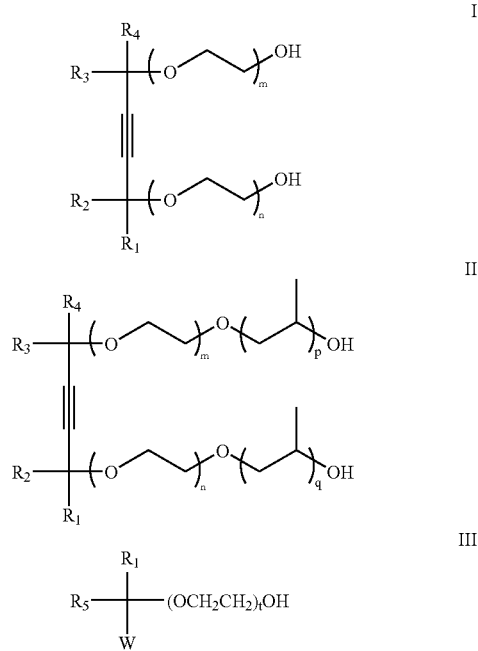

-continued

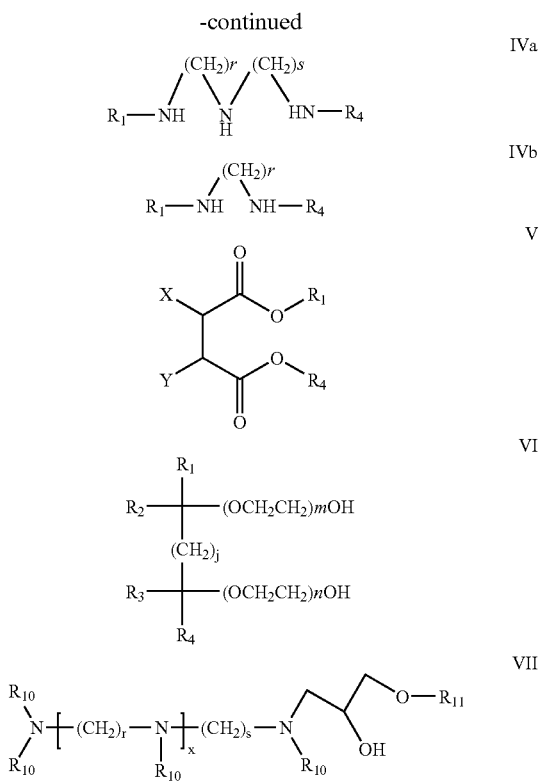

wherein $R_1$ and $R_4$ are each independently a straight or a branched alkyl group having from 3 to 10 carbon atoms; $R_2$ and $R_3$ are each independently a hydrogen atom or an alkyl group having from 1 to 5 carbon atoms; $R_5$ is a straight or a branched alkyl group having from 1 to 10 carbon atoms; $R_{10}$ is independently H or a group represented by the formula

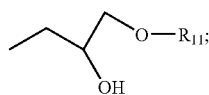

$R_{11}$ is a straight, branched, or cyclic alkyl group having from 4 to 22 carbon atoms; W is a hydrogen atom or an alkynyl group; X and Y are each independently a hydrogen atom or a hydroxyl group; m, n, p, and q are each independently a number that ranges from 0 to 20; r and s are each independently 2 or 3; t is a number that ranges from 0 to 2; j is a number that ranges from 1 to 5; and x is a number that ranges from 1 to 6.

These and other aspects of the invention will become apparent from the following detailed description.

DETAILED DESCRIPTION OF THE INVENTION

Process solutions that are used to reduce the number of defects incurred during the manufacturing of the semiconductor device and methods of using same are described herein. The surfactant within the process solution—present in minor amounts—aids in removing particulates, particularly post-CMP residuum, that may lead to defects. The process solution of the present invention may reduce defects by improving the wetting of the solution on the surface of the substrate. In some embodiments, particularly substrates having a hydrophobic surface such as low-k dielectric material, the superior dynamic wetting and low foaming characteristics of these surfactants would help decrease the level of post-CMP defects. Furthermore, after the cleaning process, the surfactants described herein may be removed from the surface using a relatively short DI water rinse without leaving any residues.

The surfactant within the process solution may allow for the reduction of equilibrium and dynamic surface tension while minimizing foaming. The substrate may be treated with the process solution after the stripping, CMP, ash cleaning, and/or etching steps have been completed. The term "post-CMP processed" describes a substrate that has been subjected to one or more chemical mechanical planarization steps or has at least a portion of its surface planarized.

In one embodiment of the present invention, the process solution, when employed as a post-CMP rinse, may also prevent the formation of "water mark" defects on the substrate surface. In this connection, a substrate having a surface containing a low dielectric constant material may be treated with the process solution of the present invention before transferring the substrate within multiple cleaning modules during the post-CMP cleaning steps. The treatment with the process solution allows the hydrophobic low dielectric constant surface to remain "wet" during the transferring process and consequently reduces "water-mark" type defects.

Suitable substrates that may be used with the process solutions disclosed herein include, but are not limited to, semiconductor materials such as gallium arsenide ("GaAs"), boronitride ("BN") silicon, and compositions containing silicon such as crystalline silicon, polysilicon, amorphous silicon, epitaxial silicon, silicon dioxide ("$SiO_2$"), silicon carbide ("SiC"), silicon oxycarbide ("SiOC"), silicon nitride ("SiN"), silicon carbonitride ("SiCN"), organosilica glasses ("OSG"), organofluorosilicate glasses ("OFSG"), fluorosilicate glasses ("FSG"), and other appropriate substrates or mixtures thereof. Substrates may further comprise a variety of layers applied thereto such as, for example, diffusion barrier layers (e.g., TiN, Ti(C)N, TaN, Ta(C)N, Ta, W, WN, TiSiN, TaSiN, SiCN, TiSiCN, TaSiCN, or W(C)N), metallization layers (e.g., copper, aluminum, alloys containing same, etc.), antireflective coatings, photoresists, organic polymers, porous organic, inorganic materials, and additional metal layers, and low dielectric constant layers.

The process solution of the present invention may have as a carrier phase or medium an aqueous-based solvent and/or non-aqueous-based solvent. The term "aqueous" as used herein, describes a solvent or liquid dispersing medium, which comprises at least 30 weight percent, preferably 50 weight percent, and more preferably at least 80 weight percent water. The preferred aqueous-based solvent is deionized water. In embodiments wherein the process solution is aqueous-based, it is desirable that at least one formula I through VII surfactant demonstrates a dynamic surface tension of less than 45 dynes/cm at a concentration of less than or equal to 5 weight percent in water at 23° C. and 1 bubble/second according to the maximum-bubble-pressure method of measuring surface tension described in *Langmuir* 1986, 2, 428–432, which is incorporated herein by reference in its entirety.

In embodiments where a non-aqueous solvent is used in addition to or in place of an aqueous solvent such as deionized water, the non-aqueous solvent selected will not react with the at least one surfactant contained therein, other additives within the process solution, or the substrate itself. Suitable non-aqueous solvents include, but are not limited to, hydrocarbons (e. g. pentane or hexane); halocarbons (e. g. Freon 113); ethers (e. g. ethylether ($Et_2O$), tetrahydrofuran ("THF"), ethylene glycol monomethyl ether, or 2-methoxyethyl ether (diglyme)); nitriles (e. g. $CH_3CN$); or aromatic compounds (e.g. benzotrifluoride). Additional non-aqueous solvents include lactates, pyruvates, and diols. These solvents may include, but are not limited to, acetone, 1,4-dioxane, 1,3-dioxolane, ethyl acetate, cyclohexanone, acetone, 1-methyl-2-pyrodidianone (NMP), methyl ethyl ketone. Still further exemplary non-aqueous solvents, include dimethylformamide, dimethylacetamide, N-methyl pyrrolidone, ethylene carbonate, propylene carbonate, glycerol and derivatives, naphthalene and substituted versions, acetic acid anyhydride, propionic acid and propionic acid anhydride, dimethyl sulfone, benzophenone, diphenyl sulfone, phenol, m-cresol, dimethyl sulfoxide, diphenyl ether, terphenyl, propylene glycol propyl ether (PGPE), methanol, ethanol, 3-heptanol, 2-methyl-1-pentanol, 5-methyl-2-hexanol, 3-hexanol, 2-heptano, 2-hexanol, 2,3-dimethyl-3-pentanol, propylene glycol methyl ether acetate (PGMEA), ethylene glycol, isopropyl alcohol (IPA), n-butyl ether, propylene glycol n-butyl ether (PGBE), 1-butoxy-2-propanol, 2-methyl-3-pentanol, 2-methoxyethyl acetate, 2-butoxyethanol, 2-ethoxyethyl acetoacetate, 1-pentanol, and propylene glycol methyl ether. The non-aqueous solvents enumerated above may be used alone or in combination with two or more solvents.

In certain embodiments, the process solution may contain at least one non-aqueous solvent that is miscible in an aqueous solvent or is water-miscible. In these embodiments, the amount of non-aqueous solvent within the process solution may range from about 1 to about 50% by weight with the balance of the solvent within the process solution comprising an aqueous solvent. Examples of water-miscible non-aqueous solvents include methanol, ethanol, isopropyl alcohol, and THF.

The present solution comprises from 10 to 500,000 ppm of at least one surfactant represented by structural formulas I through VII. Typical surfactants exhibit an amphiphilic nature, meaning that they can be both hydrophilic and hydrophobic at the same time. Amphiphillic surfactants possess a hydrophilic head group or groups, which have a strong affinity for water and a long hydrophobic tail, which is organophilic and repels water. The at least one formula I through VII surfactant used in the present invention may be ionic (i.e., anionic, cationic) or nonionic.

In certain embodiments of the present invention, the process solution may contain one or more nonionic surfactants that are acetylenic diol derivatives. The surfactants of the present invention may be represented by the following formula I or formula II:

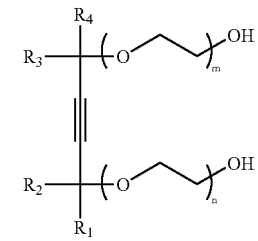

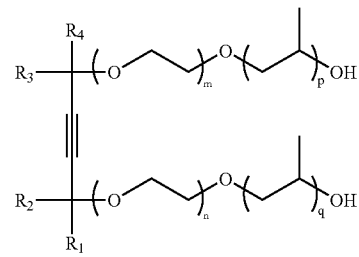

wherein $R_1$ and $R_4$ are each independently a straight or a branched alkyl chain having from 3 to 10 carbon atoms; $R_2$ and $R_3$ are each independently a hydrogen atom or an alkyl chain having from 1 to 5 carbon atoms; and m, n, p, and q are each independently a number that ranges from 0 to 20. The surfactants are commercially available from Air Products and Chemicals, Inc. of Allentown, Pa., the assignee of the present invention, under the trade names SURFYNOL® and DYNOL®. In certain preferred embodiments, the acetylenic diol portion of the molecule of formulas I or II is 2,4,5,9-tetramethyl-5-decyne-4,7-diol or 2,5,8,11-tetramethyl-6-dodecyne-5,8-diol. The acetylenic diol derived surfactants may be prepared in a number of ways including the methods described, for example, in U.S. Pat. No. 6,313,182 and EP 1115035A1, which are assigned to the assignee of the present invention and incorporated herein by reference in their entirety.

In formula I and II, the alkylene oxide moieties represented by ($OC_2H_4$) are the (n+m) polymerized ethylene oxide (EO) molar units and the moieties represented by ($OC_3H_6$) are the (p+q) polymerized propylene oxide (PO) molar units. The value of (n+m) may range from 0 to 30, preferably from 1.3 to 15, and more preferably from 1.3 to 10. The value of (p+q) may range from 0 to 30, preferably from 1 to 10, and more preferably from 1 to 2.

In certain preferred embodiments of the present invention, the process solution contains from 10 to 500,000 ppm of at least one surfactant represented by the following formulas (III) through (VII):

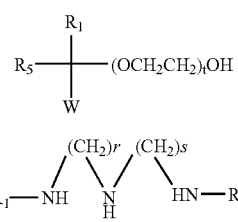

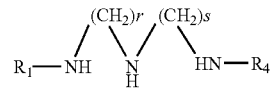

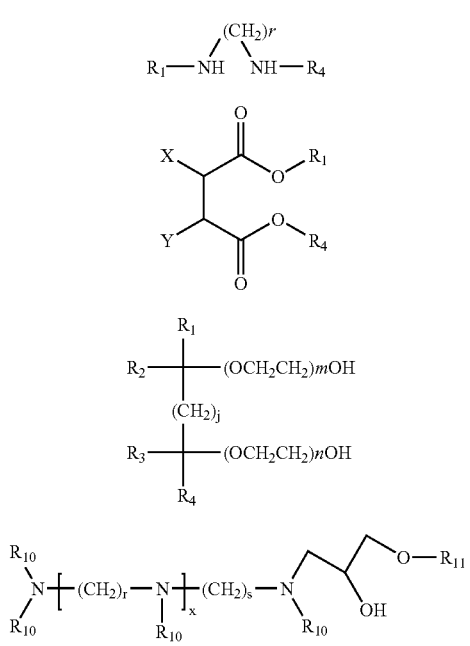

In each of the above formulas, $R_1$ and $R_4$ are each independently a straight or branched alkyl group with 3 to 10 carbon atoms; $R_2$ and $R_3$ are each independently a hydrogen atom or an alkyl group having from 1 to 5 carbon atoms; $R_5$ is a straight or branched alkyl group with 1 to 10 carbon atoms; $R_{10}$ is independently H or a group represented by the formula

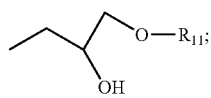

$R_{11}$ is a straight, branched, or cyclic alkyl group having from 4 to 22 carbon atoms; W is a hydrogen atom or an alkynyl group; X and Y are either a hydrogen atom or a hydroxyl group; r and s are each independently 2 or 3; t is a number ranging from 0 to 2; j is a number ranging from 1 to 5; and x is a number ranging from 1 to 6. Examples of Formula III surfactants include, but are not limited to, 3,5-dimethyl-1-hexyn-3-ol and 2,6-dimethyl-4-heptanol. An example of a Formula IVa surfactant includes, but is not limited to, N,N'-bis(1,3-dimethylbutyl) ethylene diamine. An example of a Formula V surfactant includes, but is not limited to, diisopentyl tartrate. An example of a Formula VI surfactant includes, but is not limited to, 2,4,7,9-tetramethyl-4,7-decane diol. An example of a Formula VII surfactant includes, but is not limited to, an adduct of diethylenetriamine and n-butyl glycidyl ether.

The process solution may optionally contain a dispersant. The amount of dispersant that is added to the process solution ranges from about 10 to about 500,000 ppm, preferably about 10 to about 5,000 ppm, and more preferably from about 10 to about 1,000 ppm. The term dispersant, as used herein, describes compounds that enhance the dispersion of particles such as dust, processing residue, hydrocarbons, metal oxides, pigment or other contaminants within the process solution. Dispersants suitable for the present invention preferably have a number average molecular weight that ranges from about 10 to about 500,000.

The dispersant may be an ionic or a nonionic compound. The ionic or nonionic compound may further comprise a copolymer, an oligomer, or a surfactant, alone or in combination. The term copolymer, as used herein, relates to a polymer compound consisting of more than one polymeric compound such as block, star, or grafted copolymers. Examples of a nonionic copolymer dispersant include polymeric compounds such as the tri-block EO-PO-EO co-polymers PLURONIC® L121, L123, L31, L81, L101 and P123 (BASF, Inc.). The term oligomer, as used herein, relates to a polymer compound consisting of only a few monomer units. Examples of ionic oligomer dispersants include SMA® 1440 and 2625 oligomers (Elf Alfochem).

Alternatively, the dispersant may comprise a surfactant. If the dispersant comprises a surfactant, the surfactant may be ionic (i.e., anionic, cationic) or nonionic. Further examples of surfactants include silicone surfactants, poly(alkylene oxide) surfactants, and fluorochemical surfactants. Suitable non-ionic surfactants for use in the process solution include, but are not limited to, octyl and nonyl phenol ethoxylates such as TRITON® X-114, X-102, X-45, X-15 and alcohol ethoxylates such as BRIJ® 56 ($C_{16}H_{33}(OCH_2CH_2)_{10}OH$) (ICI), BRIJ® 58 ($C_{16}H_{33}(OCH_2CH_2)_{20}OH$)(ICI). Still further exemplary surfactants include alcohol (primary and secondary) ethoxylates, amine ethoxylates, glucosides, glucamides, polyethylene glycols, poly(ethylene glycol-co-propylene glycol), or other surfactants provided in the reference McCutcheon's Emulsifiers and Detergents, North American Edition for the Year 2000 published by Manufacturers Confectioners Publishing Co. of Glen Rock, N.J.

The process solution may comprise at least one base that is present in the amount of from about 0.01 to 10% by weight of the solution. The term "base" as used herein is any compound capable of removing an acidic proton and include compounds such as, but not limited to, quaternary ammonium, amine, hydroxide, halide, alkoxide, metal amide, organolithium, or organomagnesium compounds. Exemplary bases include an ammonium hydroxide, an alkylammonium hydroxide or combinations thereof.

The process solution may comprise at least one acid that is present in the amount of from about 0.01 to 10% by weight of the solution. Exemplary acids include sulfuric acid, hydrochloric acid (HCl), citric acid, phosphoric acid, carboxylic acid, or hydrofluoric acid (HF).

The process solution may comprise at least one oxidizing agent that is present in the amount of from about 0.1 to 10% by weight of the solution. Exemplary oxidizing agents include hydrogen peroxide ($H_2O_2$), urea-hydrogen peroxide, urea peroxide, or ozone.

The process solution of the present invention may comprise at least one chelating agent that is present in the amount of from about 10 ppm to 5% by weight of the solution. Some non-limiting examples of chelating agents are the following organic acids and its isomers and salts: (ethylenedinitrilo)tetraacetic acid (EDTA), butylenediaminetetraacetic acid, cyclohexane-1,2-diaminetetraacetic acid (CyDTA), diethylenetriaminepentaacetic acid (DETPA), ethylenediaminetetrapropionic acid, ethylenediaminetetrapropionic acid, (hydroxyethyl)ethylenediaminetriacetic acid (HEDTA), N,N,N',N'-ethylenediaminetetra (methylenephosphonic) acid (EDTMP), citric acid, tartaric acid, phtalic acid, gluconic acid, saccharic acid, cathechol, gallic acid, pyrogallol, propyl gallate, glyceric acid, oxalic acid, maleic acid, phosphoric acid, and combinations thereof. Still other chelating agents include cysteine, beta-diketones such as acetylacetone, acetonyl acetone, trifluoroacetylacetone, thenoyltrifluoroacetone, or hexafluoroacetylacetone, an oxine such as 8-hydroxyquinoline, a tertiary amine such as 2-acetyl pyridine, a nitrile such as ethylene cyanohydrin, a beta-ketoimine, catechol, choline-containing compounds, trifluoroacetic anhydride, an oxime such as dimethyl glyoxime, dithiocarbamates such as bis(trifluoromethyl)dithiocarbamate, terpyridine, ethylene cyanohydrin, N-(2-hydroxyehtyl)iminodiacetic acid, and combinations thereof.

The process solution of the present invention may comprise at least one corrosion inhibitor that is present in the amount of from about 10 ppm to 5% by weight of the solution. Some non-limiting examples of corrosion inhibitors include benzotriazole (BTA) and their derivatives such as briazole, and tritriazole; ascoric acids such as ascorbic acid (Vitamin C), L(+)-ascorbic acid, isoascorbic acid, and ascorbic acid derivatives.

Various other additives may be optionally added to the process solution. These additives may include, but are not limited to, stabilizers, dissolving aids, colorants, wetting agents, antifoamers, buffering agents, and other additional surfactants. Generally, unless otherwise stated, the amount of each of these additives would be about 0.0001 to 1 percent by weight, more preferably 0.0001 to 0.1 percent by weight, based upon the total weight of the process solution. In embodiments where one or more additional surfactants are added to the process solution, the surfactant may be any of the surfactants disclosed herein or provided in the reference *McCutcheon's Emulsifiers and Detergents*.

In one embodiment of the present invention, the process solution comprises from 0.01 to 10% by weight of at least one base; from 0.1 to 10% by weight of at least one oxidizing agent; from 0 to 5% by weight of at least one chelating agent; from 10 to 500,000 ppm of at least one formula I through VII surfactant; and the balance solvent. In an alternative embodiment, the process solution comprises from 0.01 to 10% by weight dilute HF; from 10 to 500,000 ppm of at least one formula I through VII surfactant; and the balance solvent. In a further embodiment, the process solution comprises an acid such as citric acid or phosphoric acid and an oxidizing agent such as $H_2O_2$ wherein the amount of acid and oxygen contained therein ranges from 0.01 to 20% by weight; optionally from 10 ppm to 10% by weight of at least one chelating agent; from 10 to 500,000 ppm of at least one formula I through VII surfactant; and the balance solvent. In another embodiment, the process solution comprises an aqueous-based solvent such as electrolytic ionized water and from 10 to 500,000 ppm of at least one formula I through VII surfactant.

The process solution of the present invention may be prepared by mixing the at least one formula I through VII surfactant with one or more aqueous and/or non-aqueous solvents and any additional additives. In certain embodiments, the mixing may be done at a temperature range of about 40 to 60° C. to affect dissolution of the ingredients contained therein. The resulting process solution may optionally be filtered to remove any undissolved particles that could potentially harm the substrate.

The process solution is preferably applied to the surface of the substrate as a prepared solution. In alternative embodiments, the process solution can be prepared within the rinse stream just prior to or during contact with the substrate surface. For example, a certain quantity of one or more formula I through VII surfactants can be injected into a continuous stream of aqueous solvent and/or non-aqueous solvent medium that optionally includes other additives thereby forming the process solution. In some embodiments of the present invention, a portion of the at least one formula I through VII surfactant may be added to the substrate after application of the process solution. In this case, the process solution may be formed in multiple steps during the processing of the substrate. In still other embodiments of the present invention, the at least one formula I through VII surfactant can be also deposited upon or comprise the material of a high surface area device such as a cartridge or filter (which may or may not include other additives). A stream of aqueous solvent and/or non-aqueous solvent then passes through the cartridge or filter thereby forming the process solution. In still another embodiment of the present invention, the process solution is prepared during the contacting step. In this connection, at least one formula I through VII surfactant is introduced via a dropper or other means to the surface of the substrate. Water and/or non-aqueous solvent medium is then introduced to the surface of the substrate and mixes with the at least one formula I through VII surfactant on the surface of the substrate thereby forming the process solution.

In an alternative embodiment of the invention, a concentrated composition comprising at least one formula I through VII surfactant is provided that may be diluted in the aqueous solvent and/or non-aqueous solvents to provide the process solution. A concentrated composition of the invention, or "concentrate" allows one to dilute the concentrate to the desired strength and pH. In these embodiments, the concentrated composition may be made into the process solution through the use of a metering pump, three way valve, and/or similar means to add one or more solvents and dilute the concentrated composition.

A variety of means can be employed in contacting the process solution with the substrate surface. The actual conditions of the contacting step (i.e., temperature, time, and the like) may vary over wide ranges and are generally dependent on a variety of factors such as, but not limited to, the nature and amount of material to be removed on the surface of the substrate, the removal rate of the material by the chemical solution, the topography of the substrate, the hydrophobicity or hydrophilicity of the substrate surface, etc.

The contact step can be conducted in a dynamic method, a static method, or combinations thereof. The process solution may also be sprayed onto the surface of the substrate in a dynamic method such as in a continuous process or sprayed onto the surface and allowed to remain there in a static method. In some embodiments, the dynamic contacting step may be conducted while agitating the substrate. This agitation may be conducted a variety of means such as, but not limited to, vibratory motion (e.g., electromechanical or mechanical), ultrasonic motion, pulsatory motion, sonic motion, megasonic motion, acoustic motion, centrifugal motion, and combinations thereof. Further, devices such as polishing pads, brushes, and the like may be used to further aid in removing the post-CMP processing residuum. In an alternative embodiment, the contacting step may be conducted in a static method such as, for example, a puddle rinse or immersing the substrate within a bath containing the process solution. The duration of the contacting step, or time of contact of the process solution to the substrate surface, can vary from a fraction of a second to hundreds of seconds. The duration can range from 1 to 200 seconds, preferably from 1 to 150 seconds, and more preferably from 1 to 60 seconds. The temperature range for the contacting step can vary from 10 to 100° C. and more preferably from 10 to 40° C.

It is preferred that the process solution be applied to a still-wet substrate surface. In a preferred embodiment, for example, the process solution is employed as a rinse solution after the CMP processing. After CMP processing, the process solution is applied to the substrate surface as a rinse in addition to, or in place of, a deionized water rinse. While the substrate is still wet with CMP slurry and/or deionized water, the process solution may be applied in a dynamic manner or in a static manner. During dispensing, the substrate is spun slowly at a speed, for example, of 100 revolutions per minute ("rpm") to distribute the process solution over the substrate surface. For a dynamic process, the substrate is spun slowly while the process solution is dispensed continuously on the substrate. For a static process such as the puddle process, the substrate is allowed to rest for a brief period, for example, 15 seconds. After the rinse step with the process solution is complete, the rinsed wafer is then dried, for example, by spin-drying at a higher rpm.

The invention will be illustrated in more detail with reference to the following examples, but it should be understood that the present invention is not deemed to be limited thereto.

EXAMPLES

In the following examples, unless stated otherwise, properties were obtained from silicon wafers that were manufactured by Wafernet Inc. and had a low dielectric film deposited thereupon. The low-k film was deposited via either a chemical vapor deposition (CVD) or spin-on process.

The contact angle measurements were measured on the G10/DSA10 Kruss drop shape analyzer provided by Kruss USA of Charlotte, N.C. using the Sessile drop method. In the Sessile drop method, the wetting properties of a localized region on the surface of a substrate coated with a low dielectric film are estimated by measuring the contact angle between the baseline of a droplet of deionized water or process solution and the tangent at the droplet base. A high-speed camera captured the spreading of the droplet at a speed of 2 frames per second for 2 minutes and the contact angle was measured.

The refractive index measurement was obtained on an SCI Filmtek 2000 Reflectometer. Dielectric constants were determined using Hg probe technique.

Examples 1a Through 1c

Contact Angle after Treatment with Process Solutions

Process solutions contained varying amounts of surfactants derived from 2,4,7,9-tetramethyl-5-decyne-4,7-diol (m+n=5, p+q=2) (Formula II) were prepared in the following manner. A volumetric flask was charged with varying amounts of the surfactant and DI water to reach a level of 100 ml at room temperature. The mixture was agitated until the surfactant was dissolved therein to form the process solution. The amounts of surfactant in the process solutions of examples 1a, 1b, and 1c are provided in Table I.

The process solution was dispensed onto the low dielectric-coated wafer continuously for 1 minute while the wafer was spinning at 300 rpm. After the wafer dried, the contact angle of a droplet of water on the wafer surface was then measured. As a comparison, droplets of deionized water was dispensed onto the wafer in the same manner as the process solution. Table I provides the contact angle values for the various concentrations of process solutions (examples 1a through 1c) and deionized water (comparative example 1) at different drop ages expressed in seconds.

In general, contact angles of about 70° or higher may indicate that the substrate surface is very hydrophobic whereas contact angles of around 50° or below may indicate that the surface is relatively hydrophilic. As Table I illustrates, the contact angles of substrates that were treated with the process solutions of the present invention are smaller than the contact angle of the substrate treated with DI water alone and are therefore more hydrophilic. Further, higher amounts of surfactant within the process solution may lead to more surfactant adsorption and improved wetting.

TABLE I

| Example | Amt Surfactant | Contact Angle (0 sec) | Contact Angle (5 sec) | Contact Angle (10 sec) | Contact Angle (30 sec) |
| --- | --- | --- | --- | --- | --- |
| Comp. Ex. 1 - DI water | — | 83.8 | 83.9 | 83.2 | 82.8 |
| Ex. 1a | 0.15 wt % | 67.5 | 66.3 | 65.9 | 64.5 |
| Ex. 1b | 0.25 wt % | 55.2 | 55.1 | 54.8 | 54.8 |
| Ex. 1c | 0.3 wt % | 48.3 | 49.2 | 50.3 | 51.4 |

Examples 2a Through 2c

Contact Angle after Treatment with Process Solution

Process solutions consisting of various surfactants derived from 2,4,7,9-tetramethyl-5-decyne-4,7-diol (m+n=5, p+q=2) (Formula II, example 2a), 2,4,7,9-tetramethyl-5-decyne-4,7-diol (m+n=10) (Formula I, example 2b), diisopentyl tartrate (Formula V, example 2c) were prepared as described in Examples 1a through 1c. A measured amount of process solution or deionized water was dispensed upon the wafer while it was being spun continuously for about 1 minute at 100 rpm. After the wafer dried, a droplet of process solution was dispensed upon the surface of the wafer and the contact angle of the process solution on the substrate surface was measured after various intervals of time and are provided in Table II.

Lower contact angles represents stronger wetting capability of the process solution. Further, contact angles smaller than 20 degrees indicate complete wetting of the surface. In the present example, the process solutions, particularly Example 2a, enabled fast and enhanced wetting on the hydrophobic, low dielectric constant surface when compared to treatment with DI water alone or Comparative Example 2. The superior wetting properties of the process solution of the present invention may effectively enhance the removal of residues and particulates from the surface during the cleaning process. This may reduce the amount of watermark type defects.

TABLE II

| Example | Amt Surfactant | Contact Angle (0 sec) | Contact Angle (5 sec) | Contact Angle (10 sec) | Contact Angle (30 sec) |
| --- | --- | --- | --- | --- | --- |
| Comp. Ex. 2 - DI water | 0 | 80.7 | 80.7 | 80.7 | 79.7 |

TABLE II-continued

| Example | Amt Surfactant | Contact Angle (0 sec) | Contact Angle (5 sec) | Contact Angle (10 sec) | Contact Angle (30 sec) |
|---|---|---|---|---|---|
| 2a | 0.3 wt % | 27.6 | 23.6 | <20 | <20 |
| 2b | 0.35 wt % | 59 | 58.7 | 58.1 | 57 |
| 2c | 0.05 wt % | 59.3 | 56.9 | 56 | 53.9 |

Example 3

Immersion in Water Bath after Treatment with Process Solution—Change in Surface Hydrophobicity A substrate was treated with the process solutions as described in the preceding examples 2a, 2b, and 2c and then immersed in a water bath for 60 seconds. The contact angle of water droplets on the surface of the low dielectric constant film was measured and the results are provided in Table III.

Comparative example 3 shows the contact angle of water on the low-k film after it was treated in the same method as described in the proceeding paragraph, except that instead of the treatment with process solution, DI water was used. The slight decrease of contact angle from the wafer surface indicates a slight change of surface hydrophobicity just from the process alone.

Table III illustrates that after immersing the substrate in the water bath for 60 seconds, the process solution containing the surfactant washed away from the low dielectric constant surface. The low dielectric constant surface is once again very hydrophobic. The process solutions wets the surface very quickly in a dynamic fashion yet can be readily removed from the surface even in a static manner such as simple immersion. This was also confirmed by measuring the dielectric constant of the film. As shown in Table IV, treatment with process solution and subsequent immersion in DI water bath has not changed the dielectric constant of the film.

TABLE III

| Example | Amt Surfactant | Contact Angle (0 sec) | Contact Angle (5 sec) | Contact Angle (10 sec) | Contact Angle (30 sec) |
|---|---|---|---|---|---|
| Comp. Ex. - DI water | 0 | 80.7 | 80.7 | 80.7 | 79.7 |
| Ex. 2d | 0.3 wt % | 81.8 | 80.9 | 81.0 | 80.3 |
| 2e | 0.35 wt % | 81.7 | 81.1 | 81.1 | 80.8 |
| 2f | 0.05 wt % | 81.4 | 80.7 | 80.2 | 79 |

TABLE IV

| | Dielectric Constant | Refractive Index |
|---|---|---|
| Blank | 2.27 | 1.38 |
| Ex. 2d | 2.28 | 1.38 |
| Ex. 2e | 2.27 | 1.38 |
| Ex. 2f | 2.27 | 1.38 |

While the invention has been described in detail and with reference to specific examples thereof, it will be apparent to one skilled in the art that various changes and modifications can be made therein without departing from the spirit and scope thereof.

What is claimed is:

1. A method for treating a post-CMP processed substrate, the method comprising:
providing a post-CMP processed substrate wherein at least a portion of the substrate comprises a low dielectric constant film; and
contacting the substrate with a process solution comprising about 10 ppm to about 500,000 ppm of at least one surfactant having the formula (III), (IVa), (IVb), (V), (VI), (VII):

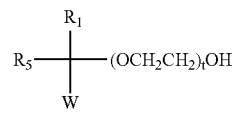

III

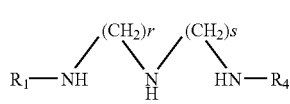

IVa

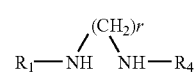

IVb

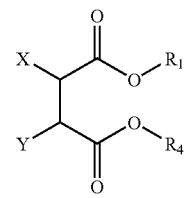

V

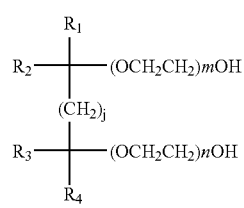

VI

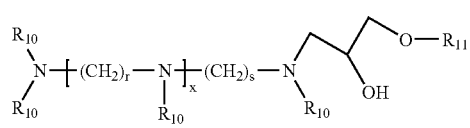

VII wherein $R_1$ and $R_4$ are each independently a straight or a branched alkyl group having from 3 to 10 carbon atoms; $R_2$ and $R_3$ are each independently a hydrogen atom or an alkyl group having from 1 to 5 carbon atoms; $R_5$ is a straight or a branched alkyl group having from 1 to 10 carbon atoms; $R_{10}$ is independently H or a group represented by the formula

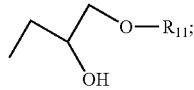

$R_{11}$ is a straight, branched, or cyclic alkyl group having from 4 to 22 carbon atoms; W is a hydrogen atom or an alkynyl group; X and Y are each independently a hydrogen atom or a hydroxyl group; m, n, p, and q are each independently a number that ranges from 0 to 20; r and s are each independently 2 or 3; t is a number that ranges from 0 to 2; j is a number that ranges from 1 to 5; and x is a number that ranges from 1 to 6.

2. The method of claim 1 wherein the process solution further comprises at least one acid.

3. The method of claim 1 wherein the process solution further comprises at least one base.

4. The method of claim 1 wherein the process solution further comprises at least one oxidizing agent.

5. The method of claim 1 wherein the process solution further comprises at least one chelating agent.

6. The method of claim 1 wherein the process solution further comprises at least one corrosion inhibitor.

7. The method of claim 1 wherein the process solution further comprises an additive selected from a stabilizer, a dissolving aid, a colorant, a wetting agent, an antifoamer, a buffering agent, a second surfactant, and combinations thereof.

8. The method of claim 1 wherein the contacting step comprises a dynamic rinse.

9. The method of claim 8 wherein the process solution exhibits a dynamic surface tension of about 45 dynes/cm$^2$ or less at 23° C. and 1 bubble/second according to the maximum-bubble-pressure method.

10. The method of claim 9 wherein the process solution exhibits substantially zero foam at a time greater than 60 seconds.

11. A method for treating a post-CMP processed substrate, the method comprising:
   providing a post-CMP processed substrate wherein at least a portion of a surface of the substrate comprises a low dielectric constant film;
   contacting the substrate with a process solution comprising at least one solvent and 10 ppm to about 500,000 ppm of at least one surfactant having the formula (III), (IVa), (IVb), (V), (VI), or (VII):

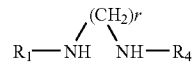

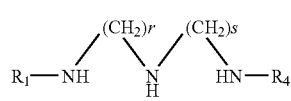

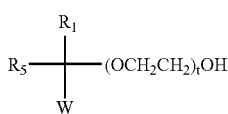

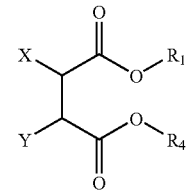

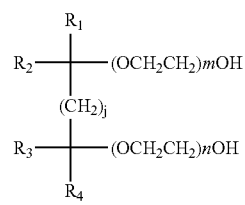

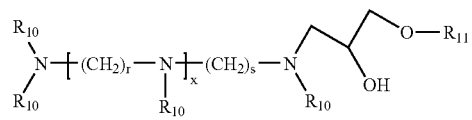

wherein $R_1$ and $R_4$ are each independently a straight or a branched alkyl group having from 3 to 10 carbon atoms; $R_2$ and $R_3$ are each independently a hydrogen atom or an alkyl group having from 1 to 5 carbon atoms; $R_5$ is a straight or a branched alkyl group having from 1 to 10 carbon atoms; $R_{10}$ is independently H or a group represented by the formula

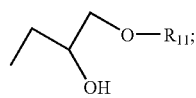

$R_{11}$ is a straight, branched, or cyclic alkyl group having from 4 to 22 carbon atoms; W is a hydrogen atom or an alkynyl group; X and Y are each independently a hydrogen atom or a hydroxyl group; m, n, p, and q are each independently a number that ranges from 0 to 20; r and s are each independently 2 or 3; t is a number that ranges from 0 to 2; j is a number that ranges from 1 to 5; and x is a number that ranges from 1 to 6; and rinsing the substrate with a deionized water rinse.

12. The method of claim 11 wherein the contacting step comprises a dynamic rinse.

13. The method of claim 11 wherein the contacting step comprises a static rinse.

14. The method of claim 11 wherein the surface of the substrate in the contacting step is wet with the deionized water rinse.

15. The method of claim 11 wherein the solvent comprises an aqueous solvent.

16. The method of claim 11 wherein the process solution is formed by injecting 10 to 500,000 ppm of the at least one surfactant into the solvent.

17. The method of claim 11 wherein the process solution is formed by applying 10 to 500,000 ppm of the at least one surfactant onto the surface of the substrate and applying the solvent to the substrate surface.

18. The method of claim 11 wherein the process solution is formed by passing the solvent through a cartridge comprising the at least one surfactant.

19. The method of claim 11 wherein the process solution is formed by diluting at least one surfactant with at least one solvent.

20. The method of claim 11 wherein a time of the contacting step ranges from 1 to 200 seconds.

21. The method of claim 11 wherein an at least one temperature of the contacting step ranges from 10 to 100° C.

22. The method of claim 15 wherein the solvent comprises a non-aqueous solvent wherein the non-aqueous solvent is miscible in the aqueous solvent.

23. The method of claim 20 wherein the time of the contacting step ranges from 1 to 150 seconds.

24. The method of claim 23 wherein the time of the contacting step ranges from 1 to 40 seconds.

25. A method for treating a post-CMP processed substrate comprising a semiconductor material, the method comprising:

providing the post-CMP processed substrate; and contacting the substrate with a process solution comprising about 10 ppm to about 500,000 ppm of at least one surfactant having the formula (III), (IVa), (IVb), (V), (VI), (VII):

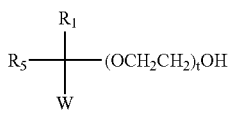

III

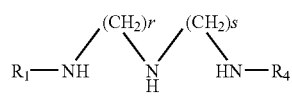

IVa

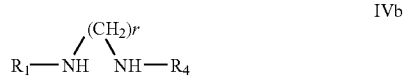

IVb

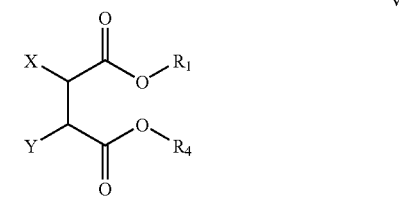

V

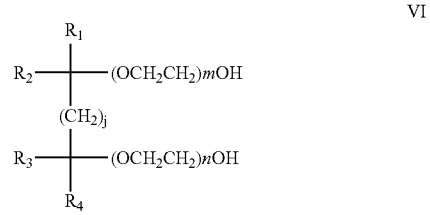

VI

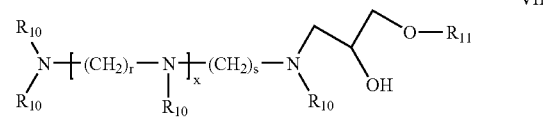

VII wherein $R_1$ and $R_4$ are each independently a straight or a branched alkyl group having from 3 to 10 carbon atoms; $R_2$ and $R_3$ are each independently a hydrogen atom or an alkyl group having from 1 to 5 carbon atoms; $R_5$ is a straight or a branched alkyl group having from 1 to 10 carbon atoms; $R_{10}$ is independently H or a group represented by the formula

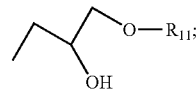

$R_{11}$ is a straight, branched, or cyclic alkyl group having from 4 to 22 carbon atoms; W is a hydrogen atom or an alkynyl group; X and Y are each independently a hydrogen atom or a hydroxyl group; m, n, p, and q are each independently a number that ranges from 0 to 20; r and s are each independently 2 or 3; t is a number that ranges from 0 to 2; j is a number that ranges from 1 to 5; and x is a number that ranges from 1 to 6.

* * * * *